United States Patent
Mar et al.

(10) Patent No.: US 7,323,940 B2
(45) Date of Patent: Jan. 29, 2008

(54) ADAPTIVE CYCLE-SLIPPED DETECTOR FOR UNLOCK DETECTION IN PHASE-LOCKED LOOP APPLICATIONS

(75) Inventors: Wing J. Mar, Rohnert, CA (US); Sebastien Louveaux, Wavre (BE); Wim Cresens, Linden (BE)

(73) Assignee: Agilent Technologies, Inc., Santa Clara, CA (US)

( * ) Notice: Subject to any disclaimer, the term of this patent is extended or adjusted under 35 U.S.C. 154(b) by 143 days.

(21) Appl. No.: 11/365,578

(22) Filed: Feb. 28, 2006

(65) Prior Publication Data

US 2007/0205833 A1    Sep. 6, 2007

(51) Int. Cl.
*H03L 7/085* (2006.01)
*H03L 7/095* (2006.01)

(52) U.S. Cl. .................................. 331/1 A; 331/DIG. 2
(58) Field of Classification Search ............... 331/1 A, 331/18, 25, DIG. 2
See application file for complete search history.

(56) References Cited

U.S. PATENT DOCUMENTS 4,473,805 A * 9/1984 Guhn .......................... 331/1 A

* cited by examiner

*Primary Examiner*—David Mis (57) ABSTRACT

An adaptive cycle-slipped detector ("ACSD") for use in a Phase-Locked Loop ("PLL") circuit. The ACSD may include a phase comparator, a phase shifter in signal communication with the phase comparator, and a cycle-slipped detector ("CSD") in signal communication with the phase shifter.

20 Claims, 6 Drawing Sheets

ADAPTIVE CYCLE-SLIPPED DETECTOR FOR UNLOCK DETECTION IN PHASE-LOCKED LOOP APPLICATIONS

BACKGROUND OF THE INVENTION

A Phase-Locked Loop ("PLL") device is basically a closed loop frequency control system that compares the phase and frequency of two signals, a reference signal and a feedback signal, and produces an error signal that is proportional to the difference between these two signals. PLL circuits may be used in many applications, with the initial applications being in radio television receivers. With the development of low-cost integrated circuit ("IC") packages, the PLL principle has been extended to many other applications, including PLL receivers capable of recovering low-level signals from satellites, AM and FM demodulators, FSK decoders, motor speed controls, isolators, and Radio Control receivers and transmitters.

Figure 1:
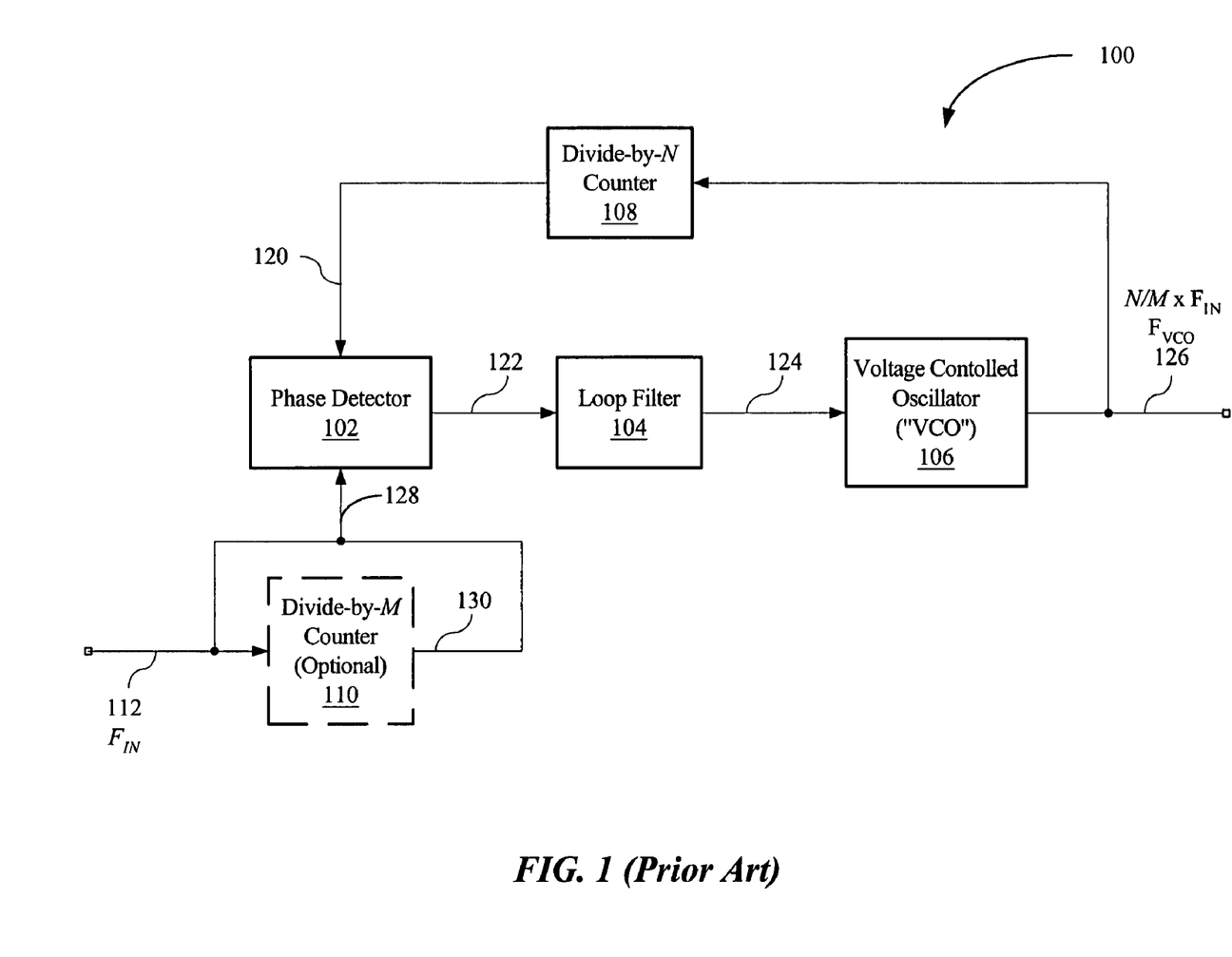
FIG. 1 shows a simplified block diagram of an example of an implementation of a conventional PLL circuit 100.

Typically, a PLL may include a phase detector, a loop filter, and a voltage controlled oscillator ("VCO") connected together in the form of a negative-feedback loop. FIG. 1 shows a simplified block diagram of an example of a conventional PLL circuit 100. The PLL circuit 100 may include a phase detector 102, loop filter 104, voltage controlled oscillator ("VCO") 106, divider 108, and optional divide-by-M counter 110.

In an example of operation of the PLL circuit 100, the phase detector 102 compares the phase of two signals, a frequency reference input signal ("$F_{IN}$") 112 and a feedback signal 120, and, in response, generates a phase-error output signal 122 that is proportional to the difference between the input phases of $F_{IN}$ 112 and the feedback signal 120. The phase-error output signal 122 may be filtered and amplified in loop filter 104 to produce a filtered signal 124. The filtered signal 124 is input to the VCO 106 that adjusts an output signal ("$F_{VCO}$") 126 to satisfy the lock conditions of the PLL circuit 100.

The output signal $F_{VCO}$ 126 may be fed through the divider 108 (such as a Divide-by-N Counter) back to the phase detector 102. The Divide-by-N Counter 108 may be either an integer divider, in which case the locked VCO 106 is tuned to N-times the Phase Detector reference frequency 128, or a fractional divider, in which case the locked VCO 106 is tuned to N F-times the Phase Detector reference frequency 128. If the optional Divide-by-M Counter 110 is placed in the reference input, a divider circuit is created and the Phase Detector reference frequency 128 is a divide input signal 130 that equal to $F_{IN}$ 112 divided by M, and the output signal $F_{VCO}$ 126 is equal to $N/M \times F_{IN}$. In general, the phase-error signal 122 causes the VCO 106 frequency to track $F_{IN}$ by the ratio N/M.

In a common application of a PLL, a modulo-N counter (108) may be connected between the VCO 106 output and the phase detector 102 in the feedback path, thus generating a VCO 106 frequency $F_{VCO}$ 126 that is an integer multiple of the input reference frequency $F_{IN}$ 128. This is an ideal method for generating clocking pulses at a multiple of the power-line frequency for integrating A/D converters (dual-slope, charge-balancing), in order to have infinite rejection of interference at the power-line frequency and its harmonics. It also provides the basic technique of frequency synthesizers.

If conditions are right, the VCO 106 will quickly "lock" to $F_{IN}$ 128, maintaining a fixed relationship with the input reference signal $F_{IN}$ 128. Generally, there are two common methods to detect whether a PLL is locked, that is, the VCO 106 output tracks $F_{IN}$ 128: An analog method based on a window detector and a digital method based on a cycle-slip detector. In the analog method, the window detector ("WD") typically monitors either the tune voltage (filtered signal 124) into the VCO 106 or the Phase-Frequency Detector 102 output voltage (phase-error signal 122). If these voltages exceed an expected range, the PLL 100 is most likely unlocked. However, because the window is typically set wide enough to accommodate design tolerances, it is possible for the PLL to sometimes be unlocked without causing the WD to detect the unlocked condition.

The cycle-slip detector ("CSD") is a digital unlock detector that works on the simple principle that once the PLL is locked, there must be a cycle-for-cycle correspondence between the feedback signal and the input reference signal applied to the phase detector. Any deviation from the one-to-one cycle-for-cycle correspondence indicates a cycle-slipped condition, which is also an unlock condition for the PLL. Generally, a simple CSD may be constructed using flip-flops and logic gates.

Unfortunately, there are several problems that may occur when utilizing a CSD to determine when a PLL circuit locks. The first is transient false-lock detection, i.e., an indication that the circuit is locked when the circuit is, in fact, not locked, which may occur in a simple CSD without a counter. Transient false-lock detection may be greatly reduced by utilizing a lock counter that requires a specified number of locked cycles to occur before the unlock signal is de-asserted, i.e., the CSD is reset to the lock position. By adjusting the value of the lock counter, the closeness of the output frequency to the final frequency of the PLL when the unlock signal is de-asserted may be predetermined and specified. This is useful when the PLL frequency has to be hopped quickly, and the settling time for the PLL needs to be reduced to the greatest extent possible.

An additional problem is that the two input signals to the CSD must be phase offset to avoid simultaneous clocking. At high input frequencies, the phase adjustment becomes more critical since the variation of the differential delay of the two signals can approach a significant portion of the reference period. This problem is aggravated when fractional division implemented with dithering is used, further reducing the window of allowable phase offset. The phase offset can always be manually adjusted to work over a limited range of reference frequency if the signal delay is fixed. When the reference frequency has to be changed over a substantial range, however, re-adjustment of the phase offset is needed. The adaptive phase shifter may be used to eliminate the manual phase offset adjustment, ensuring optimal margin over a wide range of reference frequency.

Therefore, there is a need for a CSD with an adaptive phase shifter that automatically positions the active edges of the input signals to the CSD to provide symmetrical unlock detection and thus maximum margin for accommodating dithered signals produced through fractional division, and that also has a lock counter that eliminates transient false lock indications by requiring a specified consecutive number of signal periods to occur before the CSD output can be reset to the lock position.

SUMMARY

An adaptive cycle-slipped detector ("ACSD") for use in a Phase-Locked Loop ("PLL") circuit is disclosed. The ACSD may include a phase comparator, a phase shifter in signal communication with the phase comparator, and a cycle-slipped detector ("CSD") in signal communication with the phase shifter. The phase comparator may be configured to compare a reference signal from a frequency source and a feedback signal from the PLL circuit and to generate a phase feedback signal responsive to the comparison. The phase shifter may be configured to receive the reference signal and to generate a shifted reference signal and the CSD may be configured to compare the phases of the shifted reference signal and the feedback signal and to generate a cycle-slipped signal responsive to the comparison.

In an example of operation, the ACSD may be used in a PLL application, such as a frequency synthesizer, to perform a process that includes shifting the phase of a reference signal by one-half of the period of the reference signal, and comparing the offset reference signal with an output signal from a PLL in a cycle slip detector to determine if the signals are locked. The ACSD may also include a cycle-slip counter that counts a predetermined number of locked cycles before the unlock signal is de-asserted, i.e., the ACSD output is set to the locked position.

Other systems, methods and features of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood with reference to the following figures. The components in the figures are not necessarily to scale, emphasis instead being placed upon illustrating the principles of the invention. In the figures, like reference numerals designate corresponding parts throughout the different views.

DETAILED DESCRIPTION

In the following description of the preferred embodiment, reference is made to the accompanying drawings that form a part hereof, and which show, by way of illustration, a specific embodiment in which the invention may be practiced. Other embodiments may be utilized and structural changes may be made without departing from the scope of this invention.

Figure 2:
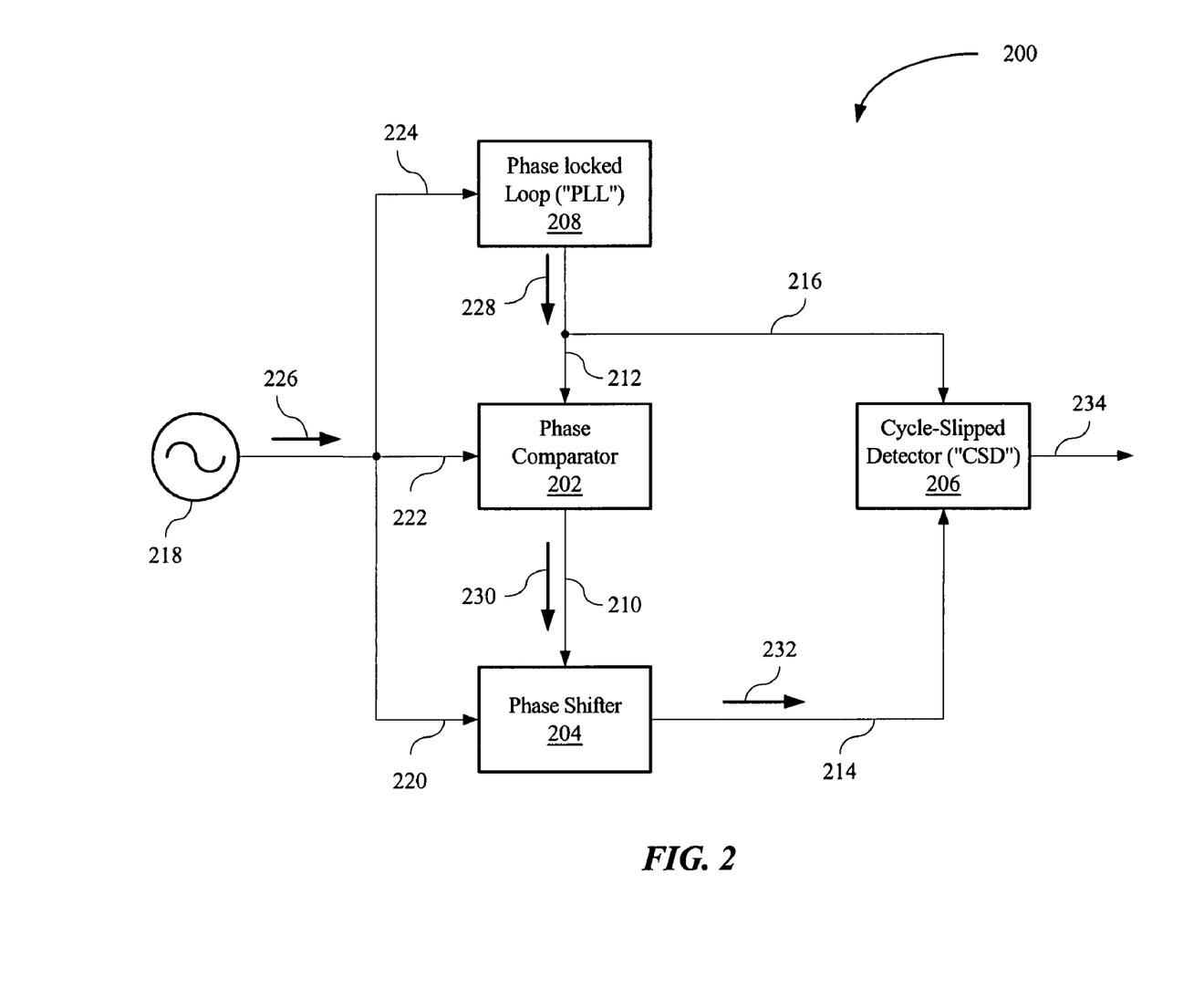
FIG. 2 shows a block diagram of an example of an implementation of an Adaptive Cycle-Slipped Detector ("ACSD").

In FIG. 2, a block diagram of an example of an implementation of an adaptive cycle-slipped detector ("ACSD") 200 is shown. The ACSD 200 may include a phase comparator 202, phase shifter 204, and a cycle-slipped detector ("CSD") 204. The phase comparator 202 may be in signal communication with the phase shifter 206 and a phase locked loop ("PLL") circuit 208 via signal paths 210 and 212, respectively. The CSD 206 may be in signal communication with the phase shifter 204 and PLL circuit 208 via signal paths 214 and 216, respectively. In this example, the phase comparator 202, phase shifter 204, and PLL circuit 208 may be in signal communication with a frequency source 218 (such as an oscillator) via signal paths 222, 220, and 224, respectively.

In an example of operation, the phase comparator 202 is a device configured to compare a reference signal 226 from the frequency source 218 and a feedback signal 228 from the PLL circuit 208, and to generate a phase feedback signal 230 responsive to the comparison. The phase shifter 204 is a device configured to receive the reference signal 226 and to generate a shifted reference signal 232 that is passed to the CSD 206. The CSD 206 is a device configured to compare the phase of the shifted reference signal 232 and the phase of the feedback signal 228, and to generate a cycle-slipped signal 234 responsive to the comparison.

In operation, the ACSD 200 may automatically position the active edges of the input signals 228 and 232 to the CSD 206 to provide symmetrical unlock detection and thus the maximum margin for accommodating dithered signals produced through fractional division. The ACSD 200 may also include a lock counter (not shown) that eliminates transient false lock indications by requiring a specified consecutive number of signal periods to occur before the ACSD 206 output (the cycle-slipped signal 234) is reset to the lock position.

Figure 3:
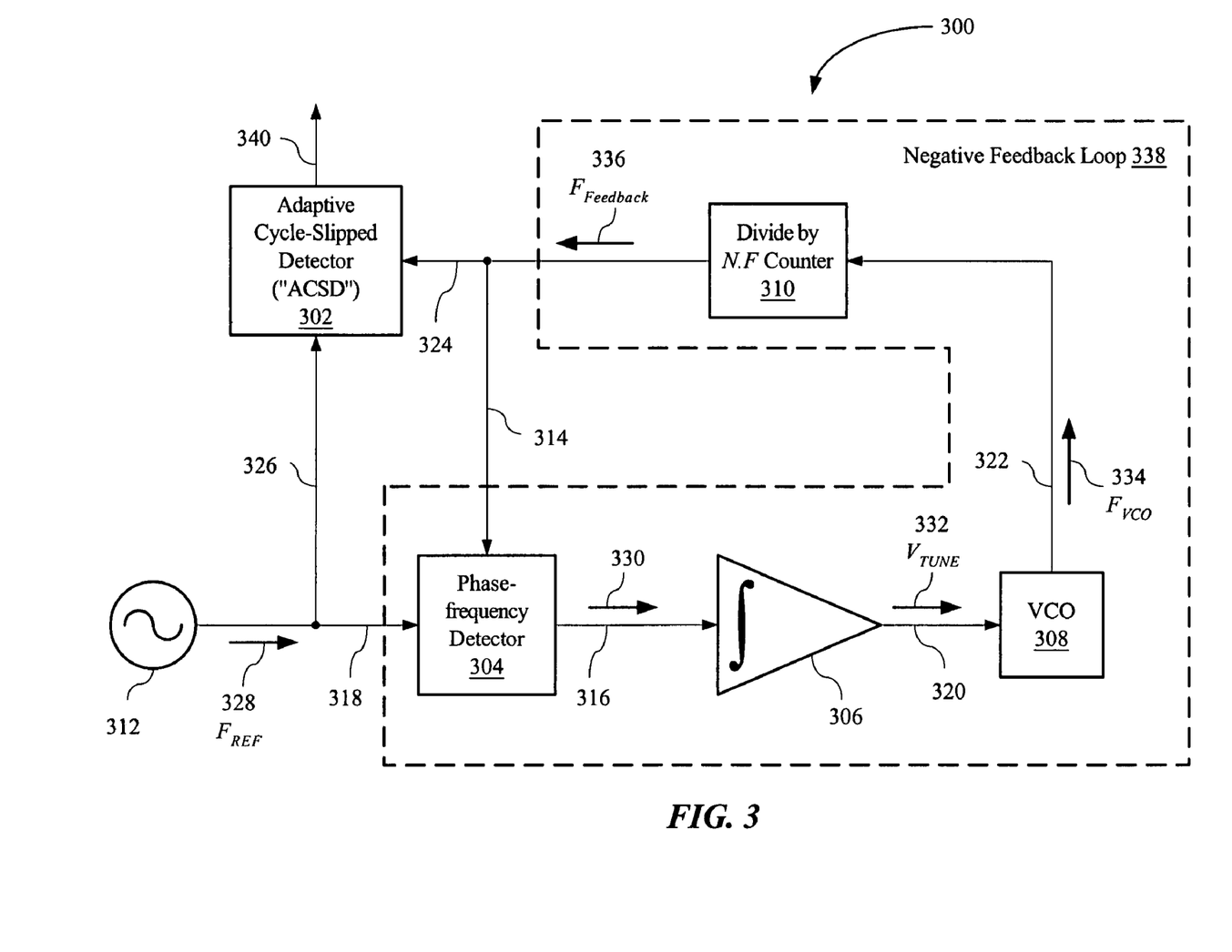
FIG. 3 shows a block diagram of an example of an implementation of a Fractional-N Phase-Locked Loop ("PLL") device with an ACSD.

In FIG. 3, a block diagram of an example of an implementation of a fractional-N PLL 300 having an ACSD 302 is shown. The PLL 300 may include a phase-frequency detector 304, loop integrator 306, VCO 308, divider 310, and the ACSD 302. The phase-frequency detector 304 may be in signal communication with the loop integrator 306, divider 310, and a frequency source 312 via signal paths 316, 314, and 318, respectively. The VCO 308 may be in signal communication with the loop integrator 306 and the divider 310 via signal paths 320 and 322, respectively. The ACSD 302 may be in signal communication with both the divider 310 and frequency source 312 via signal paths 324 and 326, respectively. As an example, the frequency source 312 may be an oscillator and the divider 310 may be a fractional loop divider such as a divide-by-N.F counter.

In an example of operation, the frequency source 312 may produce a frequency reference signal ("$F_{REF}$") 328, which is transmitted to the phase-frequency detector 304. The phase-frequency detector 304 generates a phase-error signal 330, which is input to the loop integrator 306. The output of the loop integrator 306 is the tune voltage signal ("$V_{TUNE}$") 332, which controls the output frequency ("$F_{VCO}$") 334 of the VCO 308. The output frequency $F_{VCO}$ 334 is the equivalent of the frequency output $F_{VCO}$ 126 (i.e., N/M×$F_{IN}$) shown in FIG. 1 with M being equal to 1 and N being equal to N.F.

The $F_{VCO}$ 334 is input to the fractional loop divider 310 where it is divided by a divide-by-N.F counter, which may be a programmable divide-by-N counter or any other similar type of device, to produce the feedback signal ("$F_{Feedback}$") 336 in negative feedback loop 338. This negative feedback loop 336 may be defined by the elements 304, 306, 308, and 310, and it forces $F_{Feedback}$ 336 to track $F_{REF}$ 328 such that the frequency of $F_{Feedback}$ 336 is the same as that of $F_{REF}$ 328. At that point, the output frequency 340 of fractional-N PLL 300 is N.F×$F_{REF}$.

The property that $F_{Feedback}$ 336 tracks $F_{REF}$ 328 when the fractional-N PLL 300 is locked may be used for lock detection. If there is more than one cycle of $F_{Feedback}$ 336 occurring within a single cycle of $F_{REF}$ 328 or vice versa, then a cycle has slipped and the fractional-N PLL 300 is no longer phase-locked. When the fractional-N PLL 300 is locked, the high DC loop gain of the fractional-N PLL 300 due to the loop integrator 306 would naturally force the active edge of $F_{Feedback}$ 336 to align with the active edge of $F_{REF}$ 328 in order minimize the phase error. When $F_{Feedback}$ 336 and $F_{REF}$ 328 are perfectly aligned, any deviation may be detected within one cycle. In practice, such alignment is not usually useable because the normal jitters of $F_{Feedback}$ 336 or $F_{REF}$ 328 would produce cycle-slipped outputs.

Figure 4:
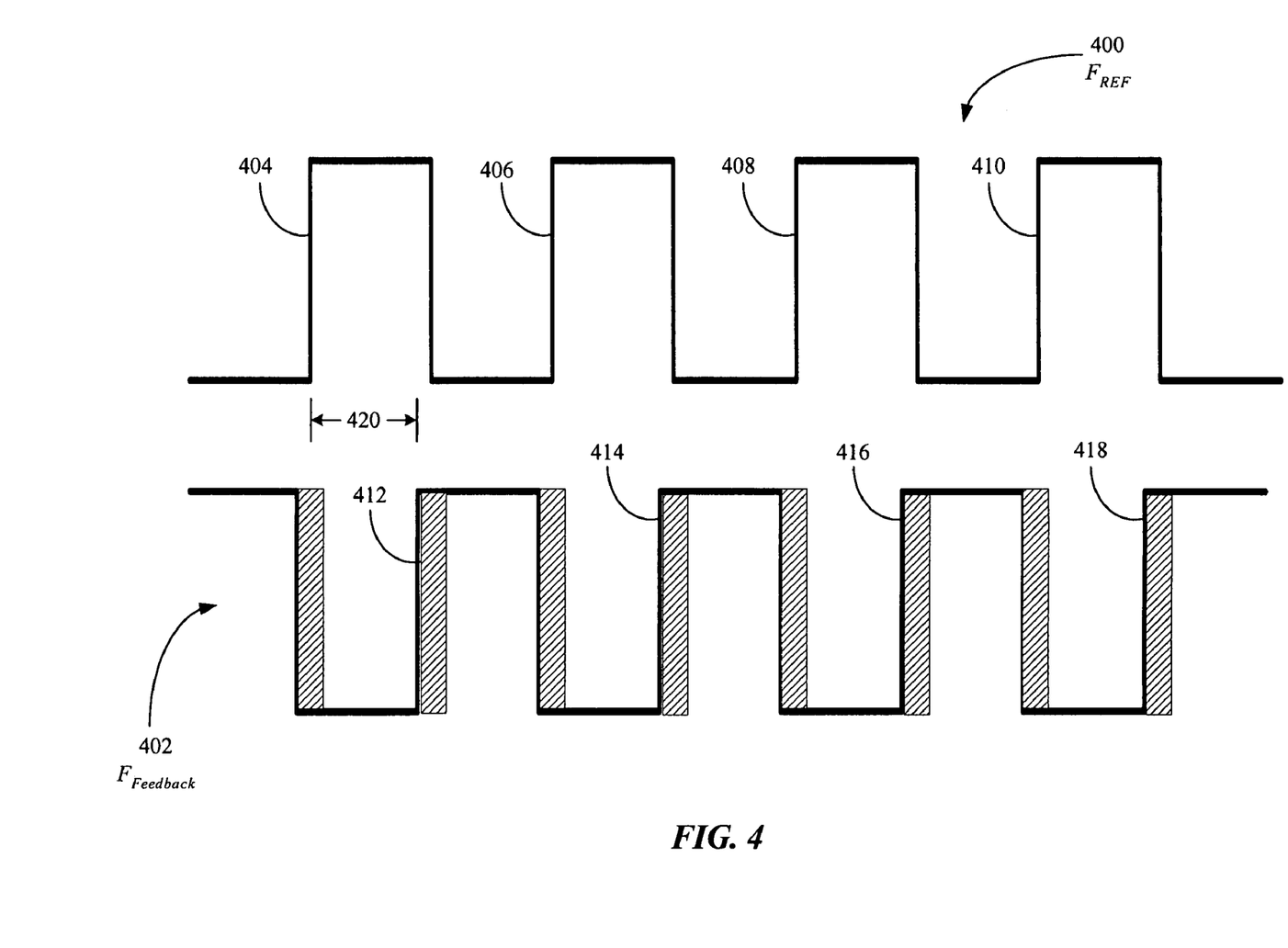
FIG. 4 shows examples of signal waveforms for the reference and the feedback signals of the PLL shown in FIG. 3.

For spurious optimization and to avoid the dead-zone of the typical digital phase-frequency detector, an offset is often introduced into the fractional-N PLL 300, forcing $F_{Feedback}$ 336 and $F_{REF}$ 328 to offset in phase from each other. This phase offset is often sufficient to allow the ACSD 302 to work properly. As an example, an ideal offset for an ACSD 302 may be to have $F_{REF}$ 328 and $F_{Feedback}$ 336 be offset from each other by 180 degrees, as shown in FIG. 4. However, this offset for the ACSD 302 may not be the optimal phase shift for optimal spurious performance.

FIG. 4 shows an example ideal waveform 400, of the reference signal $F_{REF}$ 328, FIG. 3, and an example ideal waveform 402 of the feedback signal $F_{Feedback}$ 336, FIG. 3, for cycle-slipped detection. Because the active edges (i.e., the "rising edges") of $F_{REF}$ 404, 406, 408, and 410, and $F_{Feedback}$ 412, 414, 416, and 418 are offset by one-half of the $F_{REF}$ period (180 degrees) 420, the $F_{Feedback}$ active edge may thus move in either direction with the same margin before a cycle slip can occur. Although the fractional loop divider introduces dithers into the $F_{Feedback}$ such that the averaged period of $F_{Feedback}$ equals the period of $F_{REF}$, the instantaneous period of $F_{Feedback}$ changes with every reference cycle. By offsetting $F_{REF}$ from $F_{Feedback}$ by 180 degrees, the fractional dithers may be more readily accommodated without causing false cycle-slips.

When $F_{Feedback}$ is offset by half of the $F_{REF}$ period, the $F_{Feedback}$ period would have to deviate by more than half of the $F_{REF}$ period to trigger a cycle-slip within a single $F_{REF}$ cycle. As an example, if $F_{REF}$ is 50 MHz, each $F_{REF}$ period is 20 nanoseconds. Thus the period of $F_{Feedback}$ would need to increase to more than 30 nanoseconds or decrease to less than 10 nanoseconds to cause a cycle slip within one $F_{REF}$ cycle. The corresponding frequency of $F_{Feedback}$ to trigger a cycle-slip in one $F_{REF}$ cycle may then be less than 33.3 MHz or more than 100 MHz.

As an example, when the fractional-N PLL hops from a high frequency to a low frequency that is half of the initial frequency, the value of N.F is immediately reduced to half of its previous value. The VCO momentarily remains at the initial frequency due to the delay of the loop, resulting in $F_{Feedback}$ momentarily reaching 100 MHz and causing the CSD to detect a cycle-slip within one $F_{REF}$ cycle. For a smaller frequency hop where the resulting $F_{Feedback}$ deviation is smaller, the CSD will not be able to immediately detect the cycle-slip. However, unlike an analog window detector, given enough time, the digital CSD will always detect a cycle-slip no matter how close in frequency between $F_{REF}$ and $F_{Feedback}$ may be.

Figure 5:
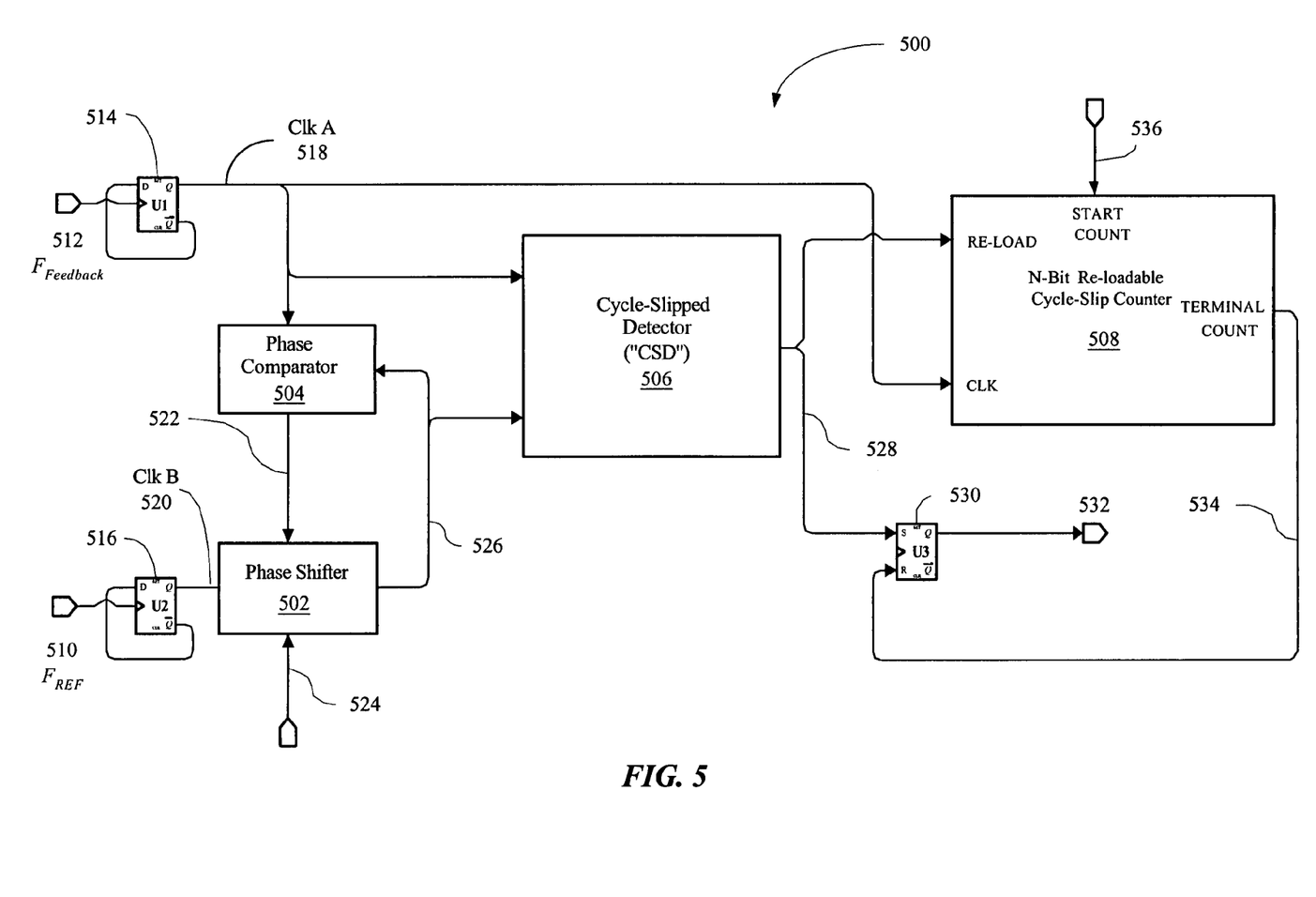
FIG. 5 shows a circuit diagram of an example of an implementation of the ASCD shown in FIG. 3.

FIG. 5 shows a circuit diagram of an example of an implementation of an ASCD 500. The ASCD 500 may include a phase shifter 502, phase comparator 504, a CSD 506, and a cycle-slip counter 508. The phase shifter 502 may be in signal communication with the phase comparator 504 and cycle-slipped detector 506, and the cycle-slipped detector 506 may be in signal communication with the cycle-slip counter 508.

In an example of operation, the ASCD 500 works well when both the $F_{REF}$ signal 510 and the $F_{Feedback}$ signal 512 have a duty cycle close to 50%. Because both of these signals are often produced from frequency dividers in the PLL (not shown), they may be pulse-like signals with asymmetrical duty cycles. Consequently, flip-flops U1 514 and U2 516 may be utilized as divide-by-2 dividers, producing clock signals Clk A 518 and Clk B 520, respectively, that may be approximately perfect square waves. However, if $F_{Feedback}$ signal 512 and $F_{REF}$ signal 510 both have duty cycles that are close to 50%, then flip-flops U1 512 and U2 516 may not be needed.

To automatically set the phase between $F_{REF}$ signal 510 and $F_{Feedback}$ signal 512, the phase of $F_{REF}$ signal 510, or its derivative 520 (i.e., Clk B signal 520), is shifted until its active edge is aligned with the falling edge of the $F_{Feedback}$ signal 512 or its derivative 518 (i.e., Clk A signal 518). This may be done using a simple method implemented with a Delay-Locked Loop ("DLL"), which is a common clock generation component in modern Field Programmable Gate Array ("FPGA") design, or any other suitable technique. In general, a DLL may utilize a programmable delay element (not shown) to adjust the delay and hence the phase of the output signal to align the output phase to the input phase. The phase shifter 502 may be an example of a programmable delay element of the DLL. The phase comparator 504 provides a feedback signal 522 to the phase shifter 502 to determine when the two signals (i.e., clock signal Clk B 520 and feedback signal 526) have been properly aligned. The method may be as follows: One of the clocks is used as a reference and is continuously sampled by the other clock. When a ONE is sampled, the phase is increased until a ZERO is seen. Once a ZERO is seen (possibly at the beginning of the process), the phase is decreased until only ONEs are sampled. This coincides with the falling edge of the sampled clock. A manual phase offset 524 may be added to the phase shifter 502 to shift the phase alignment as desired. The manual phase offset 524 may be used to compensate for internal delays that change the actual phase relationship. The manual phase offset 524 is applied with respect to the reference obtained by the previous method. The calibrating process is restarted once the two clocks get relocked after having been unlocked.

The CSD 506 compares the input clocks Clk A 518 and a phase shifted Clk B 526 to produce a Slip-Detected signal 528. The Slip-Detected signal 528 sets flip-flop U3 530 to produce a Cycle-Slipped signal 532. The Slip-Detected signal 528 also triggers the Cycle-Slip Counter 508 (which may be an N-Bit re-loadable cycle-slip counter). If the Cycle-Slip Counter 508 is allowed to reach its terminal count, flip-flop U3 530 is reset by the Terminal Count signal 534 to de-assert the Cycle-Slipped signal 532. If the Slip-Detected signal 528 continuously re-triggers the Cycle-Slip Counter 508, the Cycle-Slipped signal 532 will stay asserted.

As long as the $F_{Feedback}$ signal 512 and $F_{REF}$ signal 510 are not phase locked, the Cycle-Slip Counter 508 will be re-triggered to keep its Cycle Slipped output high. If the Cycle-Slip Counter 508 is re-loaded with the count value K (through count input 536), when the Cycle Slipped signal 532 goes low, it is certain that there have been at least K cycles where no cycle slip has occurred. If $T_{ref}$ is the period of $F_{REF}$ signal 510 and the phase offset between $F_{REF}$ signal 510 and $F_{Feedback}$ signal 512 is $T_{ref}/2$, then the averaged phase deviation of $F_{Feedback}$ signal 512 per cycle of $F_{REF}$ signal 510 prior to locking is $T_{ref}/2K$. At the instant of the Cycle-Slipped signal 532 going low, the averaged frequency of $F_{Feedback}$ signal 512 is approximately:

$$f_{VCO/N} \approx \frac{1}{T_{REF} \pm \frac{T_{REF}}{2 \cdot K}} \approx \frac{1}{T_{REF}} \cdot \left(1 \mp \frac{1}{2 \cdot K}\right) \approx f_{REF} \cdot \left(1 \mp \frac{1}{2 \cdot K}\right)$$

for large K. If K is 1000, for example, the CSD 506 will report the PLL being locked when the VCO 308, FIG. 3, is within approximately 0.05% of the lock frequency. The CSD 506 generating the lock signal is thus an indication that the PLL has reached within a specified frequency range. In a well-controlled PLL with no overshoots, the PLL output frequency should monotonically approach the final frequency after a step change in the value of N or $F_{REF}$ signal 510. After this lock point has been reached, the frequency error should continue to drop with no overshoot to trigger a cycle slip.

Figure 6:
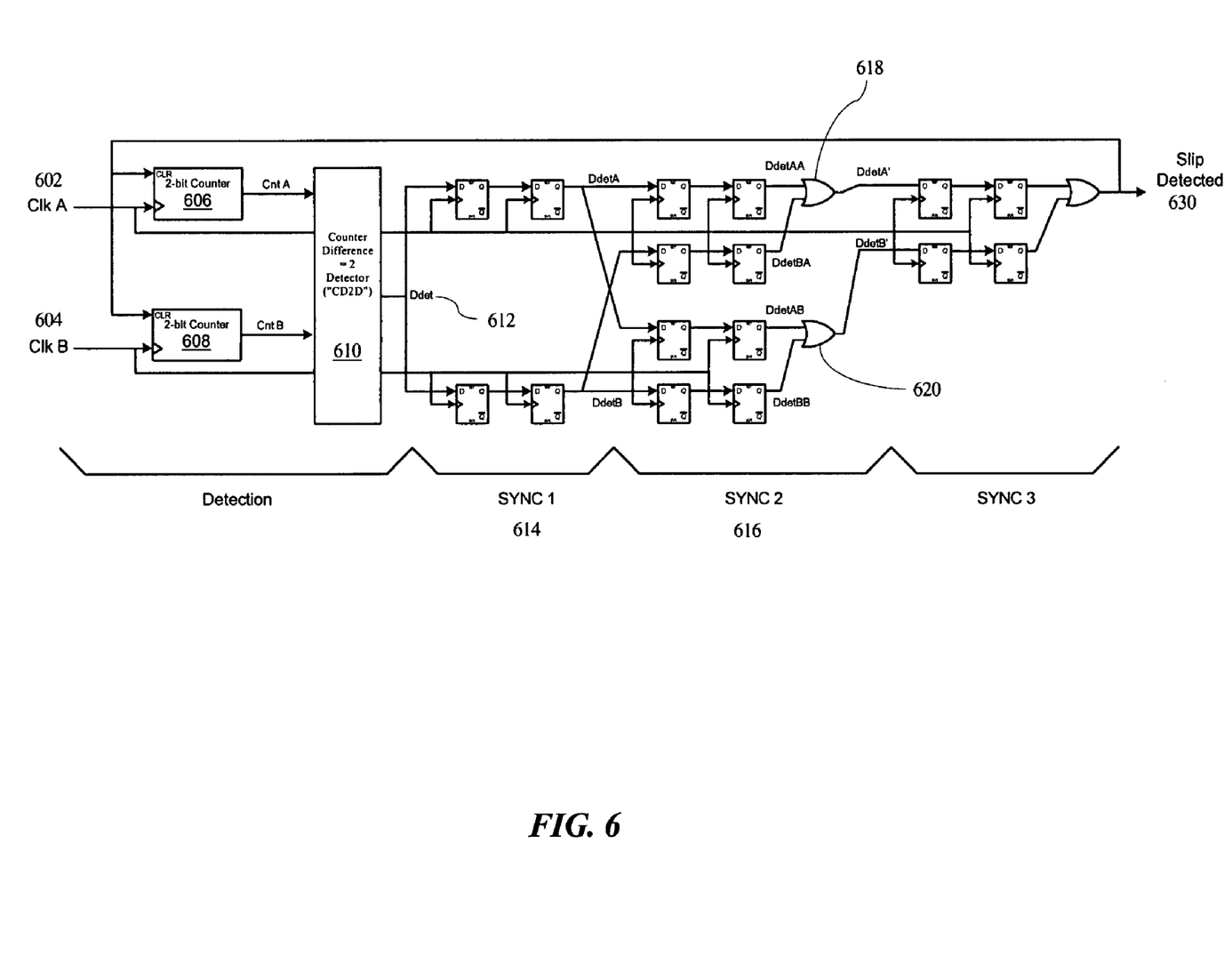
FIG. 6 shows a schematic diagram of an example of an implementation of the ASCD of FIG. 3 utilizing a Field-Programmable Gate Array ("FPGA).

FIG. 6 shows an example of an implementation of a partial FPGA implementation of the CSD 506 of FIG. 5. The CSD 600 is designed to detect a frequency difference between two clocks: Clk A 602 and Clk B 604, and generate a "Slip Detected" flag 630, synchronous to one of the two clocks, in this case Clk A 602, used to drive other logic.

Each clock drives a 2-bit free-running counter 606, 608 that increments its value at the rising edge of the clock and that wraps at binary "11". The value of the two counters 606 and 608 is combinatorially evaluated for a value difference of exactly 2 in counter difference=2 detector ("CD2D") 610. When a difference of exactly 2 occurs, this is an indication that two rising edges of one clock have occurred within the period of the other clock. On that occurring, the signal $D_{det}$ 612 will be asserted. The signal $D_{det}$ 612 is reclocked by each of the two clocks by two registers (SYNC 1) 614 resulting in $D_{detA}$ synchronous to Clk A 602 and $D_{detB}$ synchronous to Clk B 604. The signal $D_{detA}$ is then crossed to the Clk B domain and vice versa for $D_{detB}$. The crossed signals are then reclocked again by the other clock, the non-crossed signals are each delayed evenly (SYNC 2) 616, resulting in the signals $D_{detAA}$, $D_{detBA}$, $D_{detAB}$ and $D_{detBB}$.

$D_{detAA}$ and $D_{detAB}$ are OR-ed by OR-gate 618 to generate $D_{detA'}$ which indicates a cycle slip detection in the Clk A domain. $D_{detBB}$ and $D_{detBA}$ are OR-ed in OR-gate 620 to generate $D_{detB'}$ that indicates a cycle slip detection in the Clk B domain. $D_{detB'}$ is then crossed over again to the Clk A-domain and reclocked. $D_{detA'}$ is delayed evenly. Eventually the OR-ed result of the reclocked $D_{detA'}$ and $D_{detB'}$ signals generate the Cycle Slip Detected signal 630, which is entirely synchronous to the Clk A-domain.

Finally the Slip Detected signal 630 is used to asynchronously reset the two counters 606 and 608 in order to give them another equal starting point for counting. Because the two clocks are asynchronous before phase locking has occurred, there is a considerable amount of redundancy in the reclocking and crossing over of signals to minimize metastability of the CSD 600.

It will be understood that the foregoing description of numerous implementations has been presented for purposes of illustration and description. It is not exhaustive and does not limit the claimed invention to the precise forms disclosed. Modifications and variations are possible in light of the above description or may be acquired from practicing the invention. The claims and their equivalents define the scope of the invention.

What is claimed:

1. An adaptive cycle-slipped detector ("ACSD") for use in a Phase-Locked Loop ("PLL") circuit, the ACSD comprising:
    a phase comparator, the phase comparator configured to compare a reference signal from a frequency source and a feedback signal from the PLL circuit and to generate a phase feedback signal responsive to the comparison;
    a phase shifter in signal communication with the phase comparator, the phase shifter configured to receive the reference signal and to generate a shifted reference signal; and
    a cycle-slipped detector ("CSD") in signal communication with the phase shifter, the CSD configured to compare the phases of the shifted reference signal and the feedback signal and generate a cycle-slipped signal responsive to the comparison.

2. The ACSD of claim 1, wherein the cycle-slipped signal is asserted when the CSD detects more than one cycle of the feedback signal occurring within one cycle of the shifted reference signal or more than one cycle of the shifted reference signal occurring within one cycle of the feedback signal.

3. The ACSD of claim 2, wherein the cycle-slipped signal is de-asserted when the CSD detects not more than one cycle of the feedback signal occurring within one cycle of the shifted reference signal and not more than one cycle of the shifted reference signal occurring within one cycle of the feedback cycle.

4. The ACSD of claim 3, wherein the cycle-slipped signal is de-asserted responsive to a comparison of a predetermined value with a cycle-slip counter in signal communication with the CSD.

5. The ACSD of claim 4, wherein the predetermined value is re-loadable into the cycle-slip counter.

6. The ACSD of claim 5, wherein the ACSD is implemented as a monolithic integrated circuit ("IC").

7. The ACSD of claim 1, wherein the phase shifter shifts the phase of the reference signal responsive to the phase feedback signal from the phase comparator.

8. The ACSD of claim 7, wherein the phase of the reference signal is shifted until an active edge of the reference signal coincides with a falling edge of the feedback signal.

9. The ACSD of claim 8, wherein the phase shifter includes a delay-locked loop ("DDL") circuit.

10. The ACSD of claim 8, wherein the phase shifter includes means for manually adjusting the phase offset.

11. The ACSD of claim 1, wherein the CSD includes a field-programmable gate array ("FPGA").

12. A method for determining whether a feedback signal from a Phase-Locked Loop ("PLL") circuit is locked to a reference signal from a frequency source, the method comprising:
    comparing the phase of the feedback signal and the reference signal;
    generating a phase feedback signal responsive to the comparison;
    shifting the reference signal responsive to the phase feedback signal;
    comparing the shifted reference signal and the feedback signal in a cycle-slip detector; and
    generating a cycle-slipped signal responsive to the comparison.

13. The method of claim 12, further including asserting the cycle-slipped signal when the cycle-slipped detector detects more than one cycle of the feedback signal occurring within one cycle of the shifted reference signal or more than one cycle of the shifted reference signal occurring within one cycle of the feedback signal.

14. The method of claim 13, further including de-asserting the cycle-slipped signal when the cycle-slipped detector detects not more than one cycle of the feedback signal occurring within one cycle of the shifted reference signal and not more than one cycle of the shifted reference signal occurring within one cycle of the feedback signal.

15. The method of claim 14, further including;
incrementing a cycle-slip counter for each cycle of the reference signal for which the cycle-slipped detector detects not more than one cycle of the feedback signal occurring within one cycle of the shifted reference signal and not more than one cycle of the shifted reference signal occurring within one cycle of the feedback signal;
comparing the cycle-slip counter to a predetermined value; and
de-asserting the cycle-slipped signal when the cycle-slip counter equals or exceeds the predetermined value.

16. The method of claim 15, further including re-loading the predetermined value into the cycle-slip counter.

17. The method of claim 12, further including shifting the phase of the reference signal until its active edge is aligned with the falling edge of the feedback signal.

18. The method of claim 17, further including:
sampling the reference signal with the feedback signal until a one is sampled;
increasing the phase of the reference signal;
re-sampling the shifted reference signal;
repeating the steps of increasing the phase of the reference signal and re-sampling the shifted reference signal until a zero is sampled;
decreasing the phase of the reference signal;
re-sampling the shifted reference signal; and
repeating the steps of decreasing the phase of the reference signal and re-sampling the shifted reference signal until a one is sampled.

19. An adaptive cycle-slipped detector ("ACSD") for use in a Phase-Locked Loop ("PLL") circuit, the ACSD comprising:
a first means for comparing a reference signal from a frequency source and a feedback signal from the PLL circuit, and for generating a phase feedback signal responsive to the comparison;
a second means in signal communication with the first means, the second means for receiving the reference signal and for generating a shifted reference signal; and
a third means in signal communication with the second means, the third means for comparing the phases of the shifted reference signal and the feedback signal and for generating a cycle-slipped signal responsive to the comparison.

20. The ACSD of claim 19,
wherein the cycle-slipped signal is asserted when the third means detects more than one cycle of the feedback signal occurring within one cycle of the shifted reference signal or more than one cycle of the shifted reference signal occurring within one cycle of the feedback signal, and
wherein the cycle-slipped signal is de-asserted when the third means detects not more than one cycle of the feedback signal occurring within one cycle of the shifted reference signal and not more than one cycle of the shifted reference signal occurring within one cycle of the feedback cycle.

* * * * *